United States Patent
Bai

(10) Patent No.: US 9,715,018 B2
(45) Date of Patent: Jul. 25, 2017

(54) GPS OTA TESTING METHOD AND SYSTEM

(71) Applicant: HUIZHOU TCL MOBILE COMMUNICATION CO., LTD, Huizhou, Guangdong (CN)

(72) Inventor: Jian Bai, Guangdong (CN)

(73) Assignee: Huizhou TCL Mobile Communication Co., Ltd, Huizhou, Guangdong (CN)

(*) Notice: Subject to any disclaimer, the term of this patent is extended or adjusted under 35 U.S.C. 154(b) by 325 days.

(21) Appl. No.: 14/403,393

(22) PCT Filed: Aug. 20, 2013

(86) PCT No.: PCT/CN2013/081873
§ 371 (c)(1),
(2) Date: Nov. 24, 2014

(87) PCT Pub. No.: WO2014/190625
PCT Pub. Date: Dec. 4, 2014

(65) Prior Publication Data
US 2016/0223679 A1    Aug. 4, 2016

(30) Foreign Application Priority Data
May 28, 2013    (CN) .......................... 2013 1 0205602

(51) Int. Cl.
*G01S 19/23*    (2010.01)
*G01R 29/10*    (2006.01)
(Continued)

(52) U.S. Cl.
CPC ............ *G01S 19/23* (2013.01); *G01R 29/105* (2013.01); *H04B 17/318* (2015.01); *G01S 19/36* (2013.01); *H04B 7/10* (2013.01)

(58) Field of Classification Search
CPC .............................. G01S 19/23; G01S 19/235
(Continued)

(56) References Cited

U.S. PATENT DOCUMENTS 7,555,294 B2    6/2009    Qi et al.
7,925,253 B2 *  4/2011    Breit .................... G01R 29/105
                                                                455/226.1
(Continued)

FOREIGN PATENT DOCUMENTS

CN    1538775 A    10/2004
CN    102324987 A    1/2012
(Continued)

OTHER PUBLICATIONS

Brock Butler,Hakan Alparslan,Michael D. Foegelle,Ronald Borsato ,A-GPS Antenna Performance: Over-the-Air Test Method , GPS World, Sep. 1, 2009,PP52.

*Primary Examiner* — Dao Phan
(74) *Attorney, Agent, or Firm* — Klein, O'Neill & Singh, LLP

(57) ABSTRACT

A GPS OTA testing method and system is provided. The GPS OTA testing method comprises: placing a terminal under test on a rotating table in a darkroom, and generating a GPS signal by a GPS satellite signal generator in the darkroom; acquiring the satellite signal strength at each of the angles and in each of the polarization directions, and forming a signal strength direction map; searching for an optimal angle and an optimal polarization direction and acquiring a sensitivity corresponding to the optical angle and the optimal polarization direction; and acquiring a sensitivity at each of the angles and in each of the polarization directions according to the sensitivity corresponding to the optimal angle and the optimal polarization direction and according to the signal strength direction map and integrating the sensitivities to acquire an antenna signal strength.

13 Claims, 2 Drawing Sheets

(51) Int. Cl.
*H04B 17/318* (2015.01)
*G01S 19/36* (2010.01)
*H04B 7/10* (2017.01)

(58) Field of Classification Search
USPC ......... 342/165, 174, 357.21, 357.62, 357.63; 455/115.3, 226.2, 226.3
See application file for complete search history.

(56) References Cited

U.S. PATENT DOCUMENTS

| | | |
|---|---|---|
| 2006/0194553 A1 | 8/2006 | Ozaki et al. |
| 2008/0129615 A1 | 6/2008 | Breit et al. |
| 2011/0034130 A1 | 2/2011 | Konanur et al. |
| 2013/0072136 A1* | 3/2013 | Besoli ................. H01Q 9/0435 455/90.2 |
| 2016/0233970 A1* | 8/2016 | Reed ...................... H04B 17/29 |

FOREIGN PATENT DOCUMENTS

| | | |
|---|---|---|
| CN | 102386986 A | 3/2012 |
| CN | 102695198 A | 9/2012 |
| WO | WO 2008/031112 | 3/2008 |

* cited by examiner

GPS OTA TESTING METHOD AND SYSTEM

RELATED APPLICATION

The application is a national phase entry under 35 USC 371 of International Patent Application No PCT/CN2013/081873 filed on 20 Aug. 2013, which claims priority from Chinese Patent Application No. 20130205602.6 filed 28 May 2013, the disclosures of which are incorporated in their entirety by reference herein.

FIELD OF THE INVENTION

The present disclosure generally relates to the technical field of communications, and more particularly, to a Global Positioning System (GPS) On The Air (OTA) testing method and system.

BACKGROUND OF THE INVENTION

In the prior art, GPS antenna OTA testing systems adopt an Assistant GPS (AGPS) method, which takes a very long testing time and testing one frequency band normally takes 5 to 6 hours. For a GSM (Global System of Mobile Communication) four-band terminal with standard configurations or a WCDMA (Wide Band Code Division Multiple Access) three-band terminal with standard configurations, it takes 35 to 42 hours to carry out the test, so the testing efficiency is poor and the time needed is long. Moreover, the testing systems in the prior art are expensive, which leads to a high cost.

SUMMARY OF THE INVENTION

A technical problem to be solved in the present disclosure is to provide a GPS OTA testing method and system, which can reduce the testing time, improve the testing efficiency, simplify the testing system and reduce the cost.

To solve the aforesaid technical problem, the present disclosure provides a GPS OTA testing method, which comprises:

placing a terminal under test on a rotating table in a darkroom, and generating a GPS signal by a GPS satellite signal generator in the darkroom;

rotating the rotating table to pass the terminal under test through each angle, and, at each of the angles, switching a polarization direction of a testing antenna in the darkroom;

acquiring the satellite signal strength at each of the angles and in each of the polarization directions, and forming a signal strength direction map according to the satellite signal strength;

searching for an optimal angle and an optimal polarization direction according to the signal strength direction map, acquiring a signal to noise ratio (SNR) value corresponding to the optimal angle and the optimal polarization direction, and acquiring a sensitivity corresponding to the optimal angle and the optimal polarization direction according to the SNR value;

acquiring a sensitivity at each of the angles according to the sensitivity corresponding to the optimal angle and the optimal polarization direction and according to the signal strength direction map; and acquiring an antenna signal strength according to the sensitivities corresponding to all the angles and the polarization directions;

wherein the optimal angle and the optimal polarization direction are an angle and a direction which give an optimal satellite signal strength, and the angles include oblique angles and azimuth angles.

The step of acquiring the satellite signal strength at each of the angles and in each of the polarization directions comprises: when GPS positioning of the terminal under test is completed, recording and saving serial numbers and signal strengths of all current satellites every preset time period at each of the angles and in each of the polarization directions, and acquiring a signal strength median value of each of the satellites as the satellite signal strength at the angle and in the direction.

The step of acquiring the satellite signal strength at each of the angles and in each of the polarization directions, and forming a signal strength direction map according to the satellite signal strength comprises:

after the terminal under test has received the GPS signal stably, transmitting a short message to or calling the terminal under test; and recording and saving whether the terminal under test receives the short message or a ring of the call at a preset time point, and forming the signal strength direction map according to the satellite signal strength.

Acquiring a sensitivity corresponding to the optimal angle and the optimal polarization direction according to the SNR value satisfies the following relationship: $EIS_{EUT}=EIS_{GS}+(CN_{GS}-CN_{EUT})$; where, $EIS_{GS}$ represents a sensitivity of a reference terminal when being tested at the optimal angle and in the optimal polarization direction in a standard darkroom, $CN_{GS}$ represents an optimal SNR value of the reference terminal obtained in the current darkroom, $CN_{EUT}$ represents an SNR value of the terminal under test corresponding to the optimal angle and the optimal polarization direction in the current darkroom, and $EIS_{EUT}$ represents the sensitivity of the terminal under test corresponding to the optimal angle and the optimal polarization direction in the current darkroom.

Acquiring a sensitivity at each of the angles according to the sensitivity corresponding to the optimal angle and the optimal polarization direction and according to the signal strength direction map satisfies the following relationship: $EIS=EIS_{EUT}+(CN_{EUT}-CN)$; where, EIS represents the sensitivity of the terminal under test at each angle and in each polarization direction, CN represents an SNR value of the terminal under test at each angle and in each polarization direction, $CN_{EUT}$ represents an SNR value of the terminal under test at the optimal angle and in the optimal polarization direction, and $EIS_{EUT}$ represents the sensitivity of the terminal under test at the optimal angle and in the optimal polarization direction.

To solve the aforesaid technical problem, the present disclosure further provides a GPS OTA testing system, which comprises: a terminal under test, a darkroom, a GPS satellite signal generator and a processor, the darkroom comprising a testing antenna and a rotating table, and the processor being connected with the terminal under test and the GPS satellite signal generator, wherein:

the terminal under test is placed on the rotating table, and the GPS satellite signal generator generates a GPS signal in the darkroom;

the rotating table is rotated to pass the terminal under test through each angle, and the testing antenna has a polarization direction thereof switched at each of the angles;

the terminal under test acquires the satellite signal strength at each of the angles and in each of the polarization directions, and a signal strength direction map is formed according to the satellite signal strength;

the processor searches for an optimal angle and an optimal polarization direction according to the signal strength direction map, acquires an SNR value corresponding to the optimal angle and the optimal polarization direction, and acquires a sensitivity corresponding to the optimal angle and the optimal polarization direction according to the SNR value;

the processor acquires a sensitivity at each of the angles according to the sensitivity corresponding to the optimal angle and the optimal polarization direction and according to the signal strength direction map; and the processor acquires an antenna signal strength according to the sensitivities corresponding to all the angles and the polarization directions;

wherein the optimal angle and the optimal polarization direction are an angle and a direction which give an optimal satellite signal strength, and the angles include oblique angles and azimuth angles.

When GPS positioning of the terminal under test is completed, the terminal under test records and saves serial numbers and signal strengths of all current satellites every preset time period at each of the angles and in each of the polarization directions, and acquires a signal strength median value of each of the satellites as the satellite signal strength at the angle and in the direction.

After the terminal under test has received the GPS signal stably, the processor transmits a short message to or calls the terminal under test; and the terminal under test records and saves whether the terminal under test receives the short message or a ring of the call at a preset time point, and the signal strength direction map is formed according to the satellite signal strength.

Acquiring a sensitivity corresponding to the optimal angle and the optimal polarization direction according to the SNR value by the processor satisfies the following relationship: $EIS_{EUT}=EIS_{GS}+(CN_{GS}-CN_{EUT})$; where, $EIS_{GS}$ represents a sensitivity of a reference terminal when being tested at the optimal angle and the optimal polarization direction in a standard darkroom, $CN_{GS}$ represents an optimal SNR value of the reference terminal obtained in the current darkroom, $CN_{EUT}$ represents an SNR value of the terminal under test corresponding to the optimal angle and the optimal polarization direction in the current darkroom, and $EIS_{EUT}$ represents the sensitivity of the terminal under test corresponding to the optimal angle and the optimal polarization direction in the current darkroom.

Acquiring a sensitivity at each of the angles according to the sensitivity corresponding to the optimal angle and the optimal polarization direction and according to the signal strength map by the processor satisfies the following relationship: $EIS=EIS_{EUT}+(CN_{EUT}-CN)$; where, EIS represents the sensitivity of the terminal under test at each angle and in each polarization direction, CN represents an SNR value of the terminal under test at each angle and in each polarization direction, $CN_{EUT}$ represents an SNR value of the terminal under test at the optimal angle and in the optimal polarization direction, and $EIS_{EUT}$ represents the sensitivity of the terminal under test at the optimal angle and in the optimal polarization direction.

To solve the aforesaid technical problem, the present disclosure further provides a GPS OTA testing method, which comprises: placing a terminal under test on a rotating table in a darkroom, and generating a GPS signal by a GPS satellite signal generator in the darkroom: rotating the rotating table to pass the terminal under test through each angle, and, at each of the angles, switching a polarization direction of a testing antenna in the darkroom; acquiring the satellite signal strength at each of the angles and in each of the polarization directions, and forming a signal strength direction map according to the satellite signal strength; searching for an optimal angle and an optimal polarization direction according to the signal strength direction map, acquiring an SNR value corresponding to the optimal angle and the optimal polarization direction, and acquiring a sensitivity corresponding to the optimal angle and the optimal polarization direction according to the SNR value by following the relationship of: $EIS_{EUT}=EIS_{GS}+(CN_{GS}-CN_{EUT})$, where, $EIS_{GS}$ represents a sensitivity of a reference terminal when being tested at the optimal angle and the optimal polarization direction in a standard darkroom, $CN_{GS}$ represents an optimal SNR value of the reference terminal obtained in the current darkroom, $CN_{EUT}$ represents an SNR value of the terminal under test corresponding to the optimal angle and the optimal polarization direction in the current darkroom, and $EIS_{EUT}$ represents the sensitivity of the terminal under test corresponding to the optimal angle and the optimal polarization direction in the current darkroom; acquiring a sensitivity at each of the angles according to the sensitivity corresponding to the optimal angle and the optimal polarization direction and according to the signal strength direction map; acquiring an antenna signal strength according to the sensitivities corresponding to all the angles and the polarization directions; wherein the optimal angle and the optimal polarization direction are an angle and a direction which give an optimal satellite signal strength, and the angles include oblique angles and azimuth angles; wherein when GPS positioning of the terminal under test is completed, serial numbers and signal strengths of all current satellites are recorded and saved every preset time period at each of the angles and in each of the polarization directions, and a signal strength median value of each of the satellites is acquired as the satellite signal strength at the angle and in the direction.

The step of acquiring the satellite signal strength at each of the angles and in each of the polarization directions, and forming a signal strength direction map according to the satellite signal strength comprises: after the terminal under test has received the GPS signal stably, transmitting a short message to or calling the terminal under test; and recording and saving whether the terminal under test receives the short message or a ring of the call at a preset time point, and forming the signal strength direction map according to the satellite signal strength.

Acquiring a sensitivity at each of the angles according to the sensitivity corresponding to the optimal angle and the optimal polarization direction and according to the signal strength direction map satisfies the following relationship: $EIS=EIS_{EUT}+(CN_{EUT}-CN)$; where, EIS represents the sensitivity of the terminal under test at each angle and in each polarization direction, CN represents an SNR value of the terminal under test at each angle and in each polarization, $CN_{EUT}$ represents an SNR value of the terminal under test at the optimal angle and in the optimal polarization direction, and $EIS_{EUT}$ represents the sensitivity of the terminal under test at the optimal angle and in the optimal polarization direction.

Through the aforesaid solutions, the present disclosure provides the following benefits: the present disclosure tests a satellite signal strength corresponding to each of the angles and each of the polarization directions to form a signal strength direction map, acquires a sensitivity corresponding to an optimal angle and an optimal polarization direction, and then calculates a sensitivity corresponding to each of the angles and each of the polarization directions and performs integration to obtain an antenna signal strength. This can reduce the testing time, improve the testing efficiency, and simplify the testing system and reduce the cost.

DETAILED DESCRIPTION OF THE INVENTION

Figure 1:
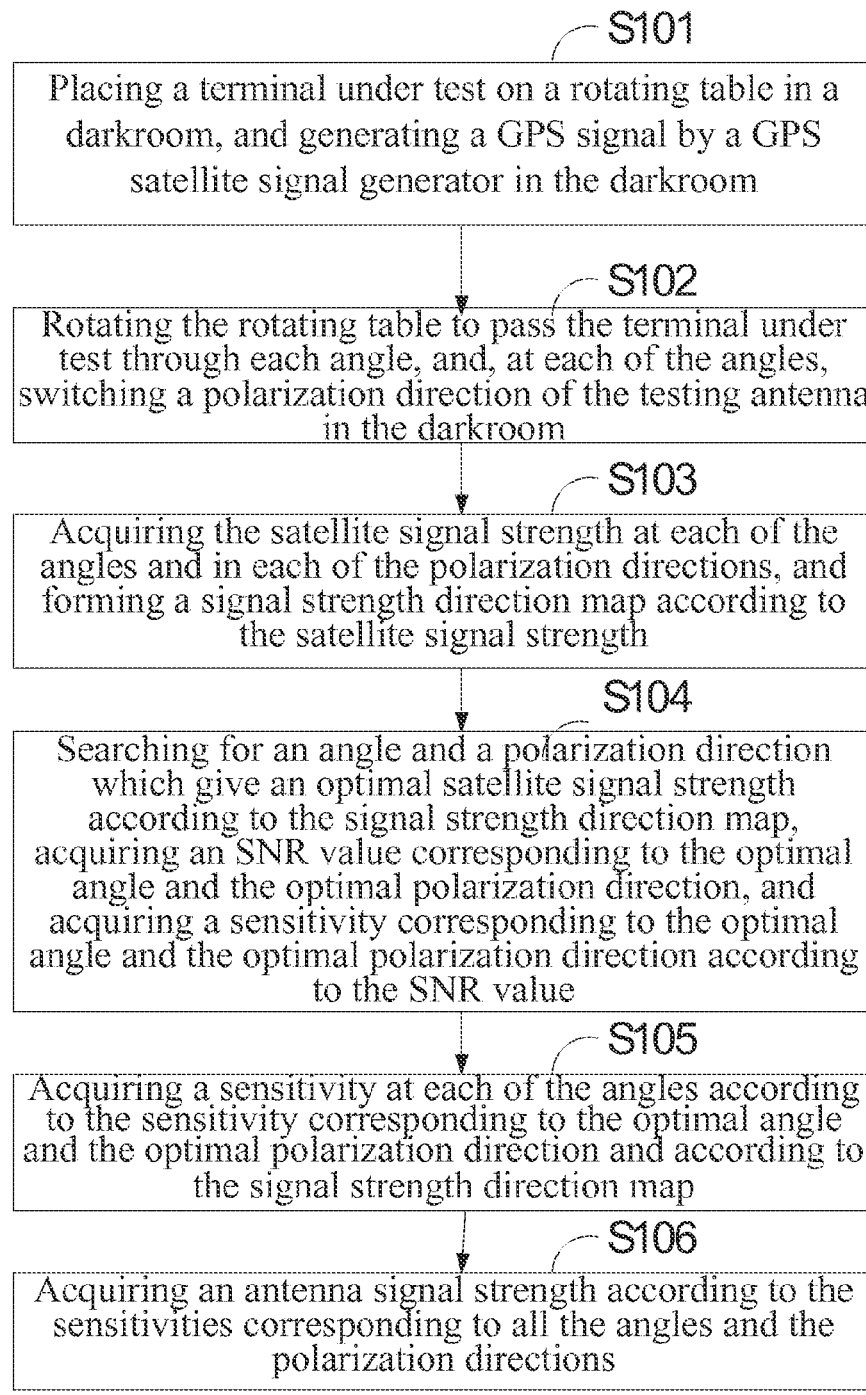
FIG. 1 is a schematic flowchart diagram of a first embodiment of a GPS OTA testing method according to the present disclosure.

Referring to FIG. 1, there is shown a schematic flowchart diagram of a first embodiment of a GPS OTA testing method according to the present disclosure. As shown in FIG. 1, the GPS OTA testing method according to the embodiment of the present disclosure comprises the following steps.

Step S101: placing a terminal under test on a rotating table in a darkroom, and generating a GPS signal by a GPS satellite signal generator in the darkroom. The GPS satellite signal generator creates a communication connection with the terminal through a testing antenna in the darkroom.

Step S102: rotating the rotating table to pass the terminal under test through each angle, and, at each of the angles, switching a polarization direction of the testing antenna in the darkroom. The angles include Theta angles (oblique angles) and Phi angles (azimuth angles). The Theta angles range from 0° to 180° at an interval of 30°; that is, the testing angles are respectively 0°, 30°, 60°, 90°, 120°, 150°, and 180°. The Phi angles range from 0° to 360° at an interval of 30°. The testing angles are respectively 0°, 30°, 60°, 90°, 120°, 150°, 180°, 210°, 240°, 270°, 300°, 330°, and 360°. At each of the Theta angles and each of the Phi angles, there are a horizontal polarization direction and a perpendicular polarization direction if the testing antenna in the darkroom is a horn antenna; and there is only one angle if the testing antenna in the darkroom is a circular polarization antenna, so there is no need to switch the polarization direction of the testing antenna. In this embodiment, a case where the testing antenna is the horn antenna is taken as an example.

Step S103: acquiring the satellite signal strength at each of the angles and in each of the polarization directions, and forming a signal strength direction map according to the satellite signal strength.

In the step S103, when GPS positioning of the terminal under test is completed, the terminal under test activates the GPS satellite signal recording software to record and save serial numbers and signal strengths of all current satellites every preset time period at each of the angles and in each of the polarization directions, and acquires a signal strength median value of all the satellites as the satellite signal strength at the angle and in the direction. The preset time period may be but is not limited to 1 second, and each test takes more than 30 seconds. In other embodiments of the present disclosure, the recording software may become unnecessary, and instead, the processor creates the communication connection with the terminal under test by using the Bluetooth or WIFI signals, and the terminal under test reports, via the Bluetooth or WIFI communication mechanism, the serial numbers and the signal strengths of all the satellites that are tracked at the current time.

After the terminal under test has arrived at each of the angles and each of the polarization directions and the GPS signals have become stable, the terminal under test acquires the satellite signal strength at each of the angles and in each of the polarization directions, and forms the signal strength direction map according to the satellite signal strength. The time period necessary for the GPS signals to become stable may be but is not limited to 3 seconds, and meanwhile, the processor transmits a short message (the content of which may be but is not limited to the current Theta angle, Phi angle and polarization direction) to or calls the terminal under test so as to confirm whether the short message has been received at each of the angles normally after the test is finished. The call does not need to be put through. The processor may transmit the short message to or call the terminal under test through a base station signal simulator by using the communication antenna in the darkroom. The terminal under test records and saves information about whether the terminal under test receives the short message or a ring of the call at a preset time point to distinguish an effective record and an ineffective record. After the testing at all the angles is completed, the terminal under test is taken out from the darkroom and then is connected to the processor. The processor reads the recorded files of the terminal under test and ranks the records containing a mark of the short message or the ring of the call in the files sequentially so as to extract satellite signal strengths at each of the Theta/Phi angles and in each of the directions to form the signal strength direction map. In this embodiment, the terminal under test may enter into a data connection mode at the same time; and by controlling the terminal under test to transmit data services at the maximum power, the interference levels received by the GPS when the communication of the terminal under test is normal and when the GPS is also operating can be tested at the same time. In other embodiments of the present disclosure, the processor transmits a satellite signal strength reading instruction through the Bluetooth or the WIFI, and the terminal under test reports the serial numbers and the satellite signal strengths of all the satellites that are tested back to the processor also through the Bluetooth or the WIFI. Then, the satellite signal strength corresponding to each of the angles and each of the polarization directions can be obtained in real time to form the signal strength direction map, and there is no need to perform subsequent processing.

Step S104: searching for an optimal angle and an optimal polarization direction according to the signal strength direction map, acquiring an SNR value corresponding to the optimal angle and the optimal polarization direction, and acquiring a sensitivity corresponding to the optimal angle and the optimal polarization direction according to the SNR value satisfies the following relationship:

$$EIS_{EUT}=EIS_{GS}+(CN_{GS}-CN_{EUT})$$

where, $EIS_{GS}$ represents a sensitivity of a reference terminal when being tested at the optimal angle and the optimal polarization direction in a standard darkroom, $CN_{GS}$ represents an optimal SNR value of the reference terminal obtained in the current darkroom, $CN_{EUT}$ represents an SNR value of the terminal under test corresponding to the optimal angle and the optimal polarization direction in the current darkroom, and $EIS_{EUT}$ represents the sensitivity of the terminal under test corresponding to the optimal angle and the optimal polarization direction in the current darkroom.

The optimal angle and the optimal polarization direction are an angle and a direction which give an optimal satellite signal strength.

Step S105: acquiring a sensitivity at each of the angles according to the sensitivity corresponding to the optimal angle and the optimal polarization direction and according to the signal strength direction map satisfies the following relationship:

$$EIS = EIS_{EUT} + (CN_{EUT} - CN)$$

where, EIS represents the sensitivity of the terminal under test at each angle and in each polarization direction, CN represents an SNR value of the terminal under test at each angle and in each polarization direction, $CN_{EUT}$ represents an SNR value of the terminal under test at the optimal angle and in the optimal polarization direction, and $EIS_{EUT}$ represents the sensitivity of the terminal under test at the optimal angle and in the optimal polarization direction. In a sensitivity test according to the embodiment of the present disclosure, it is only necessary to test the SNR value $CN_{EUT}$ of the terminal under test at the optimal angle and in the optimal polarization direction, and this can reduce the testing time by 3~4 hours, reduce the total testing time from 35~42 hours in the prior art to 30~40 minutes, and provide an efficiency that is 60 times higher.

Step S106: acquiring an antenna signal strength according to the sensitivities corresponding to all the angles and the polarization directions. The antenna signal strength is obtained by performing a spherical surface integration on the sensitivities corresponding to all the angles and the polarization directions according to the following equation:

$$TIS \cong \frac{3NM}{\pi \sum_{i=1}^{N-1} \sum_{j=0}^{M-1} \left[ \frac{1}{EIS_\theta(\theta_i, \phi_j)} + \frac{1}{EIS_\phi(\theta_i, \phi_j)} \right] \sin(\theta_i)}$$

where, N and M represent the testing point of the Theta angle and the Phi angle respectively, and in this embodiment, N=6 and M=12; $EIS_\theta(\theta_i,\phi_j)$ represents the sensitivity when the Theta angle of the rotating table is $\theta_i$, the Phi angle of the rotating table is $\phi_j$, and the testing antenna in the darkroom is in the horizontal polarization direction; $EIS_\phi(\theta_i,\phi_j)$ represents the sensitivity when the Theta angle of the rotating table is $\theta_i$, the Phi angle of the rotating table is $\phi_j$, and the testing antenna in the darkroom is in the perpendicular polarization direction.

In this embodiment, the present disclosure tests the satellite signal strength corresponding to each of the angles and each of the polarization directions by means of the terminal under test to form the signal strength direction map, and the processor acquires the sensitivity corresponding to the optimal angle and the optimal polarization direction and then calculates the sensitivity corresponding to each of the angles and each of the polarization directions and integrates the sensitivities corresponding to all the angles and all the polarization directions to obtain the antenna signal strength. This can reduce the testing time and improve the testing efficiency.

Figure 2:
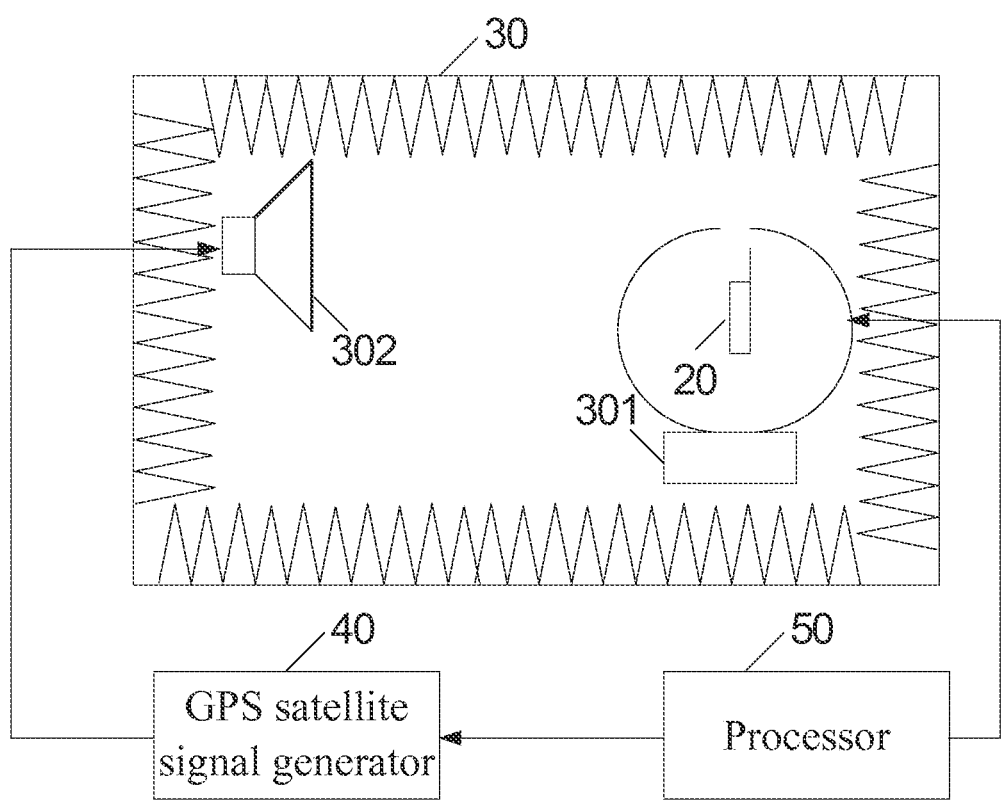
FIG. 2 is a schematic structural view of first embodiment of a GPS OTA testing system according to the present disclosure.

Referring to FIG. 2, there is shown a schematic structural view of a first embodiment of a GPS OTA testing system according to the present disclosure. As shown in FIG. 2, the GPS OTA testing system according to the present disclosure comprises a terminal under test 20, a darkroom 30, a GPS satellite signal generator 40 and a processor 50. The darkroom 30 comprises a testing antenna 302 and a rotating table 301, and the processor 50 is connected with the terminal under test 20 and the GPS satellite signal generator 40.

In this embodiment, the GPS satellite signal generator 40 creates a communication connection with the terminal under test 20 via the testing antenna 302 in the darkroom 30. The terminal under test 20 is placed on the rotating table 301 in the darkroom 30, and the processor controls the GPS satellite signal generator 40 to generate a GPS signal in the darkroom 30.

The rotating table 301 is rotated to pass the terminal under test 20 through each angle, and, and the testing antenna has a polarization direction thereof switched at each of the angles. The angles include Theta angles and Phi angles. The Theta angles range from 0° to 180° at an interval of 30°; that is, the testing angles are respectively 0°, 30°, 60°, 90°, 120°, 150°, and 180°. The Phi angles range from 0° to 360° at an interval of 30°. The testing angles are respectively 0°, 30°, 60°, 90°, 120°, 150°, 180°, 210°, 240°, 270°, 300°, 330°, and 360°. At each of the Theta angles and each of the Phi angles, there are a horizontal polarization direction and a perpendicular polarization direction if the testing antenna 302 in the darkroom 30 is a horn antenna; and there is only one angle if the testing antenna 302 in the darkroom 30 is a circular polarization antenna. In this embodiment, a case where the testing antenna is the horn antenna is taken as an example.

When GPS positioning of the terminal under test 20 is completed, the terminal under test 20 activates the GPS satellite signal recording software to record and save serial numbers and signal strengths of all current satellites every preset time period at each of the angles and in each of the polarization directions, and acquires a signal strength median value of all the satellites as the satellite signal strength at the angle and in the direction. The preset time period may be but is not limited to 1 second, and each testing takes more than 30 seconds. In other embodiments of the present disclosure, the recording software may not be needed, and instead, the processor 50 creates the communication connection with the terminal under test 20 via the Bluetooth or WIFI signals, and the terminal under test 20 reports the serial numbers and the signal strengths of all the satellites that are tracked at the current time through the Bluetooth or WIFI communication mechanism.

After the terminal under test 20 has arrived at each of the angles and each of the polarization directions and the GPS signals have become stable, the terminal under test 20 acquires a satellite signal strength at each of the angles and in each of the polarization directions to and a signal strength direction map according to the satellite signal strengths. At the same time, the processor 50 transmits a short message to or calls the terminal under test 20, and the terminal under test 20 records and saves information about whether it receives the short message or a ring of the call at a preset time point so as to distinguish effective records and ineffective records from each other. After the testing at all the angles is completed, the terminal under test is taken out from the darkroom and then is connected to the processor. The processor reads the recorded files of the terminal under test and ranks the records containing a mark of the short message or the ring of the call in the files sequentially so as to extract the satellite signal strength at each of the Theta/Phi angles and in each of the directions and form the signal strength direction map. In other embodiments of the present disclosure, the processor 50 transmits a satellite signal strength reading instruction via the Bluetooth or the WIFI, and the terminal under test 20 reports the satellite signal strengths that are tested back to the processor 50 also via the Bluetooth or the WIFI. Then, the serial numbers and the satellite signal strengths of all the satellites corresponding to each of the angles and each of the polarization directions can be obtained in real time to form the signal strength direction map, and it is unnecessary to perform subsequent processing.

Searching for an optimal angle and an optimal polarization direction according to the signal strength direction map, acquiring an SNR value corresponding to the optimal angle and the optimal polarization direction, and acquiring a sensitivity corresponding to the optimal angle and the optimal polarization direction according to the SNR value by the processor 50 satisfies the following relationship:

$$EIS_{EUT} = EIS_{GS} + (CN_{GS} - CN_{EUT})$$

where, $EIS_{GS}$ represents a sensitivity of a reference terminal when being tested at the optimal angle and the optimal polarization direction in a standard darkroom 30, $CN_{GS}$ represents an optimal SNR value of the reference terminal obtained in the current darkroom, $CN_{EUT}$ represents an SNR value of the terminal under test 20 corresponding to the optimal angle and the optimal polarization direction in the current darkroom, and $EIS_{EUT}$ represents the sensitivity of the terminal under test 20 corresponding to the optimal angle and the optimal polarization direction in the current darkroom. The optimal angle and the optimal polarization direction are an angle and a direction which give an optimal satellite signal strength.

Acquiring a sensitivity at each of the angles according to the sensitivity corresponding to the optimal angle and the optimal polarization direction and according to the signal strength direction map by the processor 50 satisfies the following relationship:

$$EIS = EIS_{EUT} + (CN_{EUT} - CN)$$

where, EIS represents the sensitivity of the terminal under test 20 at each angle and in each polarization direction, CN represents an SNR value of the terminal under test 20 at each angle and in each polarization direction, $CN_{EUT}$ represents an SNR value of the terminal under test 20 at the optimal angle and in the optimal polarization direction, and $EIS_{EUT}$ represents the sensitivity of the terminal under test 20 at the optimal angle and in the optimal polarization direction.

The processor 50 acquires an antenna signal strength according to the sensitivities corresponding to all the angles and the polarization directions. The antenna signal strength is obtained by performing a spherical surface integration on the sensitivities corresponding to all the angles and the polarization directions according to the following equation:

$$TIS \cong \frac{3NM}{\pi \sum_{i=1}^{N-1} \sum_{j=0}^{M-1} \left[ \frac{1}{EIS_\theta(\theta_i, \phi_j)} \right] + \frac{1}{EIS_\phi(\theta_i, \phi_j)} \sin(\theta_i)}$$

where, N and M represent the testing point of the Theta angle and the Phi angle respectively, and in this embodiment, N=6 and M=12; $EIS_\theta(\theta_i, \phi_j)$ represents that the sensitivity when the Theta angle of the rotating table is $\theta_i$, the Phi angle of the rotating table $\phi_j$, and the testing antenna in the darkroom is in the horizontal polarization direction; $EIS_\phi(\theta_i, \phi_j)$ represents the sensitivity when the Theta angle of the rotating table is $\theta_i$, the Phi angle of the rotating table is $\phi_j$, and the testing antenna in the darkroom is in the perpendicular polarization direction.

In this embodiment, the testing system of the present disclosure comprises the terminal under test 20, the darkroom 30, the GPS satellite signal generator 40 and the processor 50. The terminal under test is placed on the rotating table in the darkroom, the GPS satellite signal generator generates a GPS signal in the darkroom, and the terminal under test 20 tests the satellite signal strength corresponding to each of the angles and each of the polarization directions to form the signal strength direction map. On the basis of this, the optimal angle and the optimal polarization direction are searched for and the sensitivity corresponding to the optimal angle and the optimal polarization direction is acquired. Then the processor 50 calculates the sensitivity corresponding to each of the angles and each of the polarization directions and integrates the sensitivities corresponding to each of the angles and each of the polarization directions to acquire the antenna signal strength. This can reduce the testing time, improve the testing efficiency, simplify the testing system and reduce the cost.

According to the above descriptions, the present disclosure tests the satellite signal strength corresponding to each of the angles and each of the polarization directions by means of the terminal under test to form the signal strength direction map, and the processor acquires the sensitivity corresponding to the optimal angle and the optimal polarization direction and then calculates the sensitivities corresponding to all the angles and all the polarization directions and integrates the sensitivities to obtain the antenna signal strength. This can reduce the testing time, improve the testing efficiency, simplify the testing system and reduce the cost.

What described above are only the embodiments of the present disclosure, but are not intended to limit the scope of the present disclosure. Any equivalent structures or equivalent process flow modifications that are made according to the specification and the attached drawings of the present disclosure, or any direct or indirect applications of the present disclosure in other related technical fields shall all be covered within the protection scope of the present disclosure.

What is claimed is:

1. A Global Positioning System (GPS) On The Air (OTA) testing method, comprising:
   placing a terminal under test on a rotating table in a darkroom, and generating a GPS signal by a GPS satellite signal generator in the darkroom;
   rotating the rotating table to pass the terminal under test through each angle, and, at each of angles, switching a polarization direction of a testing antenna in the darkroom;
   acquiring a satellite signal strength at each of the angles and in each of polarization directions, and forming a signal strength direction map according to the satellite signal strength, wherein the angles include oblique angles and azimuth angles;
   searching for an optimal angle and an optimal polarization direction according to the signal strength direction map, acquiring a signal to noise ratio (SNR) value corresponding to the optimal angle and the optimal polarization direction, and acquiring a sensitivity corresponding to the optimal angle and the optimal polarization direction according to the SNR value;
   acquiring a sensitivity at each of the angles according to the sensitivity corresponding to the optimal angle and the optimal polarization direction and according to the signal strength direction map; and acquiring an antenna signal strength according to sensitivities corresponding to all the angles and the polarization directions;

wherein the optimal angle and the optimal polarization direction are an angle and a direction, which give an optimal satellite signal strength in the signal strength direction map, from the angles and the polarization directions.

2. The method of claim 1, wherein the step of acquiring the satellite signal strength at each of the angles and in each of the polarization directions comprises:

when GPS positioning of the terminal under test is completed, recording and saving serial numbers and signal strengths of all current satellites every preset time period at each of the angles and in each of the polarization directions, and acquiring a signal strength median value of each of the satellites as the satellite signal strength at the angle and in the polarization direction.

3. The method of claim 1, wherein the step of acquiring the satellite signal strength at each of the angles and in each of the polarization directions, and forming a signal strength direction map according to the satellite signal strength comprises:

after the terminal under test has received the GPS signal stably, transmitting a short message to or calling the terminal under test; and recording and saving whether the terminal under test receives the short message or a ring of the call at a preset time point, and forming the signal strength direction map according to the satellite signal strength.

4. The method of claim 1, wherein acquiring a sensitivity corresponding to the optimal angle and the optimal polarization direction according to the SNR value satisfies the following relationship:

$$EIS_{EUT}=EIS_{GS}+(CN_{GS}-CN_{EUT})$$

where, $EIS_{GS}$ represents a sensitivity of a reference terminal when being tested at the optimal angle and in the optimal polarization direction in a standard darkroom, $CN_{GS}$ represents an optimal SNR value of the reference terminal obtained in the current darkroom, $CN_{EUT}$ represents an SNR value of the terminal under test corresponding to the optimal angle and the optimal polarization direction in the current darkroom, and $EIS_{EUT}$ represents the sensitivity of the terminal under test corresponding to the optimal angle and the optimal polarization direction in the current darkroom.

5. The method of claim 4, wherein acquiring a sensitivity at each of the angles according to the sensitivity corresponding to the optimal angle and the optimal polarization direction and according to the signal strength direction map satisfies the following relationship:

$$EIS=EIS_{EUT}+(CN_{EUT}-CN)$$

where, EIS represents the sensitivity of the terminal under test at each angle and in each polarization direction, CN represents an SNR value of the terminal under test at each angle and in each polarization direction, $CN_{EUT}$ represents an SNR value of the terminal under test of the terminal under test at the optimal angle and in the optimal polarization direction, and $EIS_{EUT}$ represents the sensitivity of the terminal under test at the optimal angle and in the optimal polarization direction.

6. A GPS OTA testing system, comprising a terminal under test, a darkroom, a GPS satellite signal generator and a processor, the darkroom comprising a testing antenna and a rotating table, and the processor being connected with the GPS satellite signal generator, wherein:

the terminal under test is placed on the rotating table, and the GPS satellite signal generator generates a GPS signal in the darkroom;

the rotating table is rotated to pass the terminal under test through each angle, and the testing antenna has a polarization direction thereof switched at each of the angles;

the terminal under test acquires a satellite signal strength at each of the angles and in each of polarization directions, and a signal strength direction map is formed according to the satellite signal strength, wherein the angles include oblique angles and azimuth angles;

the processor searches for an optimal angle and an optimal polarization direction according to the signal strength direction map, acquires an SNR value corresponding to the optimal angle and the optimal polarization direction, and acquires a sensitivity corresponding to the optimal angle and the optimal polarization direction according to the SNR value;

the processor acquires a sensitivity at each of the angles according to the sensitivity corresponding to the optimal angle and the optimal polarization direction and according to the signal strength direction map; and the processor acquires an antenna signal strength according to sensitivities corresponding to all the angles and the polarization directions;

wherein the optimal angle and the optimal polarization direction are an angle and a direction, which give an optimal satellite signal strength in the signal strength direction map, from the angles and the polarization directions.

7. The system of claim 6, wherein when GPS positioning of the terminal under test is completed, the terminal under test records and saves serial numbers and signal strengths of all current satellites every preset time period at each of the angles and in each of the polarization directions, and acquires a signal strength median value of each of the satellites as the satellite signal strength at the angle and in the polarization direction.

8. The system of claim 6, wherein after the terminal under test has received the GPS signal stably, the processor transmits a short message to or calls the terminal under test; and the terminal under test records and saves whether the terminal under test receives the short message or a ring of the call at a preset time point, and the signal strength direction map is formed according to the satellite signal strength.

9. The system of claim 6, wherein acquiring a sensitivity corresponding to the optimal angle and the optimal polarization direction according to the SNR value by the processor satisfies the following relationship:

$$EIS_{EUT}=EIS_{GS}+(CN_{GS}-CN_{EUT})$$

where, $EIS_{GS}$ represents a sensitivity of a reference terminal when being tested at the optimal angle and the optimal polarization direction in a standard darkroom, $CN_{GS}$ represents an optimal SNR value of the reference terminal obtained in the current darkroom, $CN_{EUT}$ represents an SNR value of the terminal under test corresponding to the optimal angle and the optimal polarization direction in the current darkroom, and $EIS_{EUT}$ represents the sensitivity of the terminal under test corresponding to the optimal angle and the optimal polarization direction in the current darkroom.

10. The system of claim 9, wherein acquiring a sensitivity at each of the angles according to the sensitivity corresponding to the optimal angle and the optimal polarization direction and according to the signal strength map by the processor satisfies the following relationship:

$$EIS = EIS_{EUT} + (CN_{EUT} - CN)$$

where, EIS represents the sensitivity of the terminal under test at each angle and in each polarization direction, CN represents an SNR value of the terminal under test at each angle and in each polarization direction, $CN_{EUT}$ represents an SNR value of the terminal under test at the optimal angle and in the optimal polarization direction, and $EIS_{EUT}$ represents the sensitivity of the terminal under test at the optimal angle and in the optimal polarization direction.

11. A GPS OTA testing method, comprising:

placing a terminal under test on a rotating table in a darkroom, and generating a GPS signal by a GPS satellite signal generator in the darkroom;

rotating the rotating table to pass the terminal under test through each angle, and, at each of angles, switching a polarization direction of a testing antenna in the darkroom;

acquiring the satellite signal strength at each of the angles and in each of polarization directions, and forming a signal strength direction map according to the satellite signal strength, wherein the angles include oblique angles and azimuth angles;

searching for an optimal angle and an optimal polarization direction according to the signal strength direction map, acquiring a signal to noise ratio (SNR) value corresponding to the optimal angle and the optimal polarization direction, and acquiring a sensitivity corresponding to the optimal angle and the optimal polarization direction according to the SNR value by following the relationship of:

$$EIS_{EUT} = EIS_{GS} + (CN_{GS} - CN_{EUT})$$

where, $EIS_{GS}$ represents a sensitivity of a reference terminal when being tested at the optimal angle and the optimal polarization direction in a standard darkroom, $CN_{GS}$ represents an optimal SNR value of the reference terminal obtained in the current darkroom, $CN_{EUT}$ represents an SNR value of the terminal under test corresponding to the optimal angle and the optimal polarization direction in the current darkroom, and $EIS_{EUT}$ represents the sensitivity of the terminal under test corresponding to the optimal angle and the optimal polarization direction in the current darkroom;

acquiring a sensitivity at each of the angles according to the sensitivity corresponding to the optimal angle and the optimal polarization direction and according to the signal strength direction map; and acquiring an antenna signal strength according to sensitivities corresponding to all the angles and the polarization directions;

wherein the optimal angle and the optimal polarization direction are an angle and a direction, which give an optimal satellite signal strength in the signal strength direction map, from the angles and the polarization directions;

wherein when GPS positioning of the terminal under test is completed, serial numbers and signal strengths of all current satellites are recorded and saved every preset time period at each of the angles and in each of the polarization directions, and a signal strength median value of each of the satellites is acquired as the satellite signal strength at the angle and in the polarization direction.

12. The method of claim 11, wherein the step of acquiring the satellite signal strength at each of the angles and in each of the polarization directions, and forming a signal strength direction map according to the satellite signal strength comprises:

after the terminal under test has received the GPS signal stably, transmitting a short message to or calling the terminal under test; and recording and saving whether the terminal under test receives the short message or a ring of the call at a preset time point, and forming the signal strength direction map according to the satellite signal strength.

13. The method of claim 11, wherein acquiring a sensitivity at each of the angles according to the sensitivity corresponding to the optimal angle and the optimal polarization direction and according to the signal strength direction map satisfies the following relationship:

$$EIS = EIS_{EUT} + (CN_{EUT} - CN)$$

where, EIS represents the sensitivity of the terminal under test at each angle and in each polarization direction, CN represents an SNR value of the terminal under test at each angle and in each polarization, $CN_{EUT}$ represents an SNR value of the terminal under test of the terminal under test at the optimal angle and in the optimal polarization direction, and $EIS_{EUT}$ represents the sensitivity of the terminal under test at the optimal angle and in the optimal polarization direction.

* * * * *